(12) United States Patent  (10) Patent No.: US 7,046,564 B2
Brox et al.                  (45) Date of Patent:     May 16, 2006

(54) SEMICONDUCTOR MEMORY

(75) Inventors: Martin Brox, München (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/878,676

(22) Filed: Jun. 29, 2004

(65) Prior Publication Data
US 2005/0052916 A1   Mar. 10, 2005

(30) Foreign Application Priority Data
Jun. 30, 2003 (DE) ................ 103 29 378
Jul. 24, 2003 (DE) ................ 103 33 776

(51) Int. Cl.
*G11C 7/00* (2006.01)

(52) U.S. Cl. ..................... 365/203; 365/222

(58) Field of Classification Search ............... 365/203
See application file for complete search history.

(56) References Cited

U.S. PATENT DOCUMENTS

| 5,339,274 | A | * | 8/1994 | Dhong et al. ............... 365/203 |
| 5,805,508 | A | * | 9/1998 | Tobita ................... 365/189.09 |
| 6,031,779 | A | * | 2/2000 | Takahashi et al. .......... 365/226 |
| 6,233,188 | B1 | | 5/2001 | Kai |
| 6,418,073 | B1 | | 7/2002 | Fujita |

* cited by examiner

*Primary Examiner*—Thong Q. Le
(74) *Attorney, Agent, or Firm*—Morrison & Foerster LLP

(57) ABSTRACT

The invention relates to semiconductor memories, and in particular, to DRAMs with a memory subunit including a memory cell in which a data value is stored and which is adapted to be connected with a bit line to which a complementary bit line is assigned, and a precharge/equalize circuit assigned to the memory cell, the precharge/equalize circuit serving to charge, prior to the reading out of the memory cell, the bit line and the complementary bit line in the region of the memory cell to the same voltage level, and being switched off during the reading out of the memory cell. The semiconductor memory in addition has a control circuit connected with the precharge/equalize circuit for switching on and off the precharge/equalize circuit.

23 Claims, 5 Drawing Sheets

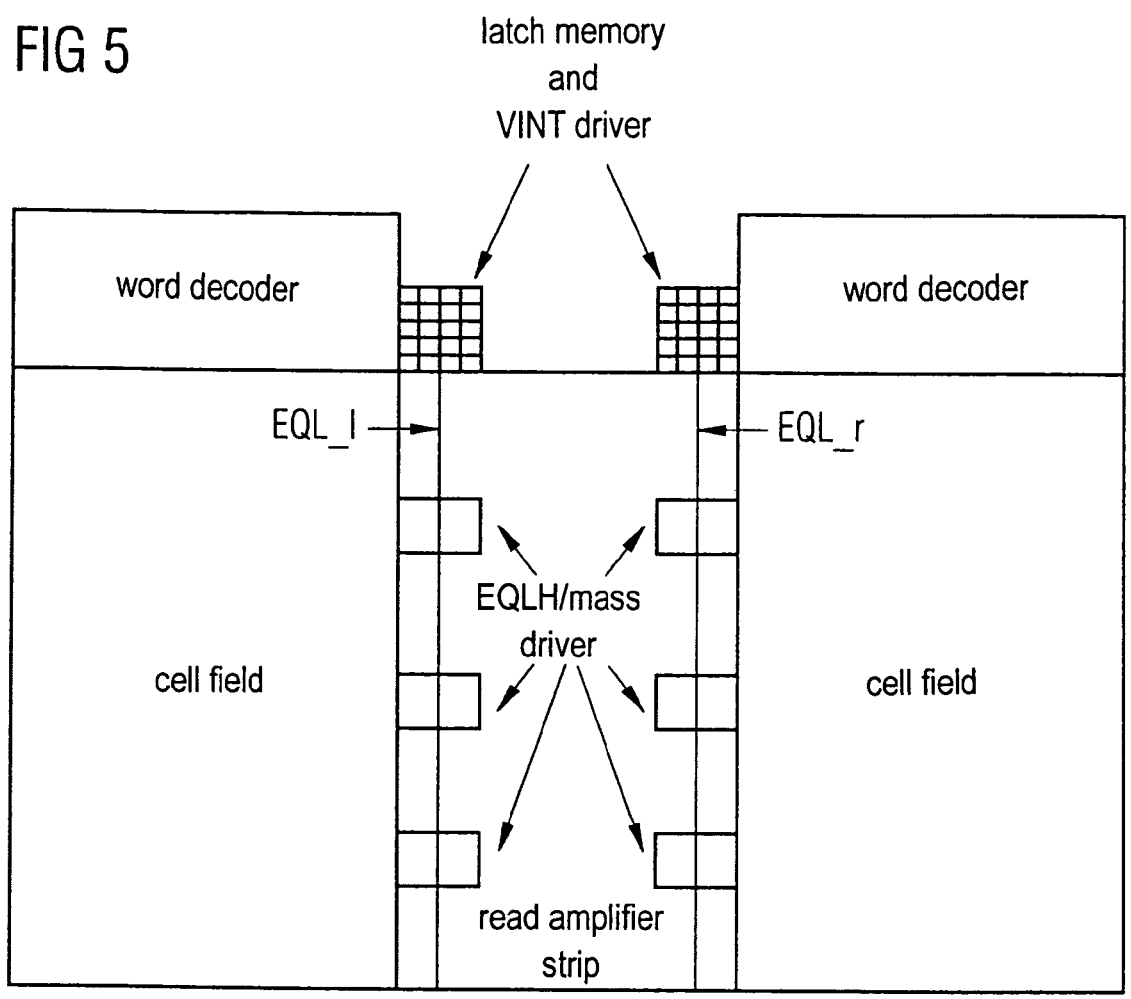

SEMICONDUCTOR MEMORY

CLAIM FOR PRIORITY

This application claims the benefit of German Application DE 103 29 378.7, which was filed in the German language on Jun. 30, 2003, the contents of which are hereby incorporated by reference.

TECHNICAL FIELD OF THE INVENTION

The invention relates to a semiconductor memory, and in particular to a DRAM (Dynamic Random Access Memory).

BACKGROUND OF THE INVENTION

In DRAMS, the memory cells consisting substantially of capacitors are connected to bit lines so as to transmit a data value to be read out from a memory cell or a data value to be read into a memory cell. On the reading out of a memory cell, an access transistor that is connected with the capacitor of a memory cell is connected through by the activation of a word line, and the charge condition stored in the capacitor is applied to the bit line. Subsequently, the weak signal emanating from the capacitor is amplified by a read amplifier. The read amplifier comprises complementary signal inputs. The bit lines connected to these signal inputs are referred to as bit line and complementary bit line.

In today's DRAMS, the read amplifiers are, as a rule, used as divided parts so as to safe chip space. In so doing, a read amplifier is used both during the reading out of a memory cell positioned at the left and a memory cell positioned at the right along a bit line next to the read amplifier.

Prior to the reading out of the memory cells, the corresponding bit line sections, i.e. the corresponding sections of the non-complementary bit line and of the complementary bit line, are, by so-called precharge/equalize circuits that are connected with the bit lines, precharged to the same potential, which corresponds to half the voltage of a bit line in the h-state (=VBLH/2). This ensures that no differences occur prior to the reading out between the potential of a section of the bit line and the section of the complementary bit line assigned thereto, which might superimpose or adulterate the small amount of charge transferred by the capacitor of a memory cell to the bit line during reading out. Directly prior to the reading out of the memory cells are the precharge/equalize circuits which are connected to the bit line sections that are adapted to be connected with the memory cell to be read out and with the read amplifier switched off.

Known DRAMS moreover comprise isolation transistors which serve to decouple the read amplifier during the reading out of the cells from the side that is not to be read out.

With known DRAMs, bias voltages are applied outside the read and write cycles to the gate terminals of the isolation transistors which, as a rule, consist of two NMOS-FETs, the source-drain paths of which are adapted to interrupt the corresponding bit line sections, said bias voltages corresponding to the voltage (VINT) generated internally on the DRAM chip. Directly prior to the reading out of a memory cell is the one side of the read amplifier that could be connected with the memory cell that is not to be read out coupled off the bit lines by the gate terminals of the isolation transistors positioned on this side of the read amplifier being put to mass potential. Simultaneously, the other side of the read amplifier is coupled in an improved manner by the gate voltage that is applied to the gate terminals of the isolation transistors positioned on the other side of the read amplifier being slightly increased from its initial value VINT to a voltage value VPP.

The actual reading out of the memory cell is initiated shortly thereafter by appropriate word line signals connecting through the access transistors that are connected with the memory capacitors. Subsequently, appropriate activating voltages are applied to the read amplifier, whereupon the read amplifier amplifies the potential differences transferred from the memory capacitors to the two bit line sections.

In the case of previous DRAMs, the voltage (VEQL) applied to the gate terminals of the MOS-FETs of the precharge/equalize circuit, which resulted in the activation of the precharge-/equalize circuits and in the precharging of the corresponding bit line sections prior to the actual reading out and/or writing in of a memory cell, corresponded to the internal chip voltage VINT applied to the isolation transistors prior to the reading out/writing in of a memory cell. This was an efficient and simple solution since VINT is available practically everywhere on the chip and need not be generated expensively by a charge pump circuit.

However, this simple solution involves a number of problems in the case of future cell field architectures of DRAMs which have to do with reduced operating voltages so as to realize low power consumption of the memory chip.

Thus, in the case of the reduced operating voltage (VINT), the time up to the complete precharging of the bit lines would become too long and might therefore violate predetermined component specifications. This could only be counteracted by a pumped voltage which would, for instance, be generated by a charge pump circuit from the internal chip voltage (VINT), being used for triggering the precharge/equalize circuits. Since the entire capacity of the line (EQL line) positioned along the bit lines for triggering the numerous precharge/equalize circuits is very large, the increased voltage (VEQL) would result in a distinctly increased power consumption of the DRAM during the read out process vis-à-vis a DRAM that can do without pumped voltage VEQL. A high power consumption results in particular also from the fact that the memory cell contents regularly have to be refreshed with the DRAM, so that an increased power consumption results even if the device is not active. This counteracts the reduction of power consumption originally to be achieved by the reduction of the operating voltage of the chip and has a negative effect in particular with battery-operated devices such as PDAs or mobile phones incorporating the DRAM. To achieve a battery lifetime as long as possible, the power consumption will have to be reduced as much as possible with such devices.

SUMMARY OF THE INVENTION

The invention provides an improved semiconductor memory and in particular an improved DRAM which can do—vis-à-vis previous semiconductor memories—with low operating voltage and, moreover, with reduced power consumption.

In one embodiment of the invention, there is a semiconductor memory with a memory subunit including a memory cell in which a data value is stored and which is adapted to be connected with a bit line to which a complementary bit line is assigned, and a precharge/equalize circuit assigned to the memory cell, the precharge/equalize circuit serving to charge, prior to the reading out of the memory cell, the bit line and the complementary bit line in the region of the memory cell to the same voltage level, and being switched off during the reading out of the memory cell, wherein the semiconductor memory in addition comprises a control circuit connected with the precharge/equalize circuit for switching on and off the precharge/equalize circuit, and wherein the control circuit for switching on and off the precharge-/equalize circuit is designed such that it applies a control signal with a first voltage level to the precharge/equalize circuit for switching on the precharge/equalize circuit and for precharging the bit lines in the normal memory cell self-refresh mode, and applies a control signal with a second voltage level to the precharge/equalize circuit for switching on the precharge/equalize circuit and for precharging the bit lines in the normal memory cell access mode, said second voltage level differing from the first voltage level and being selected such that the period of time between the output of the control signal and the finishing of the precharging of the bit lines in the memory cell self-refresh mode is larger than in the normal memory cell access mode.

BRIEF DESCRIPTION OF THE DRAWINGS

In the following, the invention will be explained in detail with reference to the embodiments illustrated in the drawings, in which:

FIG. 5 shows a section from the layout of a DRAM chip in which the arrangement of different parts of an embodiment of the memory according to the invention on a chip region is illustrated.

DETAILED DESCRIPTION OF THE INVENTION

Figure 1:
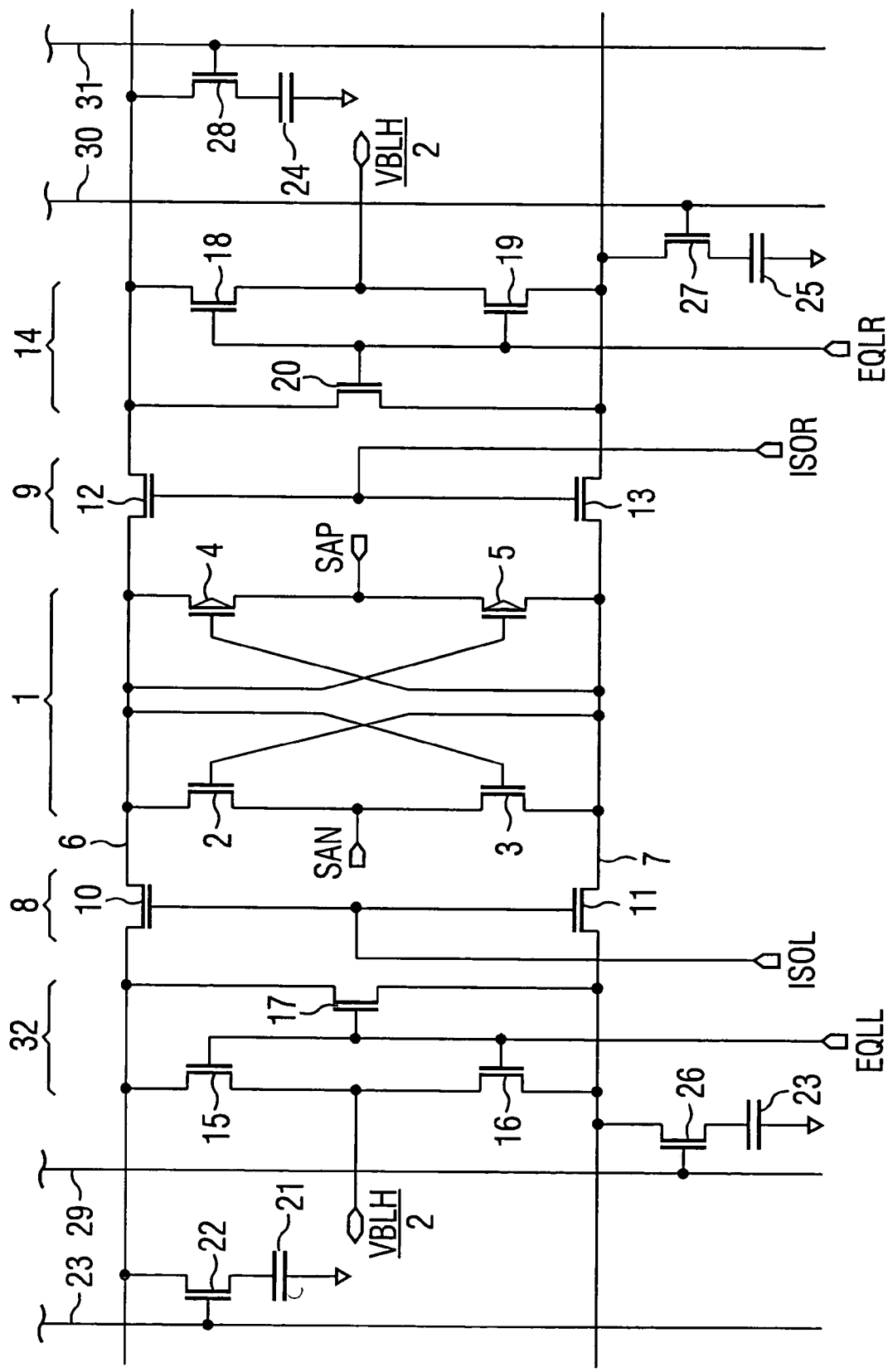
FIG. 1 shows a section from a DRAM that is relevant for the invention.

The section from a DRAM illustrated in FIG. 1 shows a read amplifier 1 including two NMOS-FETs 2 and 3 and two PMOS-FETs 4 and 5, connected in the manner of a flip-flop. The one end of the source-drain path of the first NMOS-FET 2 is connected with the bit line 6 while its gate terminal is connected with the complementary bit line, and the other end of the source-drain path is connected with an end of the source-drain path of the second NMOS-FET 3, the source-drain path of which is connected at its other end with the complementary bit line 7. The gate terminal of the second NMOS-FET 3 is connected with the bit line 6. The one end of the source-drain path of the first PMOS-FET 4 is connected with the bit line 6 while its gate terminal is connected with the complementary bit line, and the other end of the source-drain path is connected with an end of the source-drain path of the second PMOS-FET 5, the source-drain path of which is at its other end connected with the complementary bit line 7. The gate terminal of the second PMOS-FET 5 is connected with the bit line 6. On activating the read amplifier, the voltages SAN or SAP, respectively, are applied to the connection points of the source-drain paths of the two NMOS-FETs 2 and 3 and the two PMOS-FETs 4 and 5.

The type of read amplifier circuit illustrated in FIG. 1 is known in prior art and is, for instance, described in the book "VLSI Memory Chip Design" by Kiyoo Itoh, Publishing House Springer, Berlin, Heidelberg, New York, 2001, on pages 15–17. This section of the book is therefore expressly included in the instant description by this indication. A detailed description of the functioning of the read amplifier circuit illustrated in FIG. 1 is therefore refrained from.

The read amplifier circuit 1 is connected with an isolation circuit 8 and 9, respectively, at the left and at the right. The isolation circuits 8 and 9 include two NMOS-FETs 10, 11 and 12, 13, respectively, the source-drain paths of which are adapted to interrupt the bit lines 6 and 7 to decouple the corresponding side of the read amplifier during reading out and/or writing in of the memory cells positioned on the respective other side of the read amplifier. The gate terminals of the NMOSFETs of an isolation circuit which are connected with one another can be triggered via the control voltage ISOL (in the case of the isolation circuit positioned at the left of the read amplifier) or the control voltage ISOR (in the case of the isolation circuit positioned at the right of the read amplifier), respectively.

The memory subunit of a DRAM illustrated in FIG. 1 in addition comprises two precharge/equalize circuits 32 and 14 which are illustrated in FIG. 1 at the left and at the right next to the isolation circuits 8 and 9. The precharge-/equalize circuits 32 and 14 serve to charge the corresponding sections of the bit line and of the complementary bit line prior to the reading out and/or writing in of a memory cell to the same voltage, which corresponds to half the voltage of a bit line in the h-state (VBLH/2).

Each precharge/equalize circuit consists of three NMOS-transistors 15, 16, 17 or 18, 19, 20, respectively. The source-drain path of the one of the three NMOS-transistors 17 or 20, respectively, is connected between the bit line and the complementary bit line. The source-drain paths of the two other NMOS-transistors 15, 16 or 18, 19, respectively, are connected in series, with the series connection also being connected between the bit line and the complementary bit line. The voltage VBLH/2 is available at the connection point of the source-drain paths of these two NMOS-transistors 15, 16 or 18, 19, respectively. The gate terminals of the three NMOS-FETs 15, 16, 17 or 18, 19, 20, respectively, of a precharge/equalize circuit are connected with one another and with a control voltage EQLL or EQLR, respectively, which is supplied by a control circuit (not illustrated in FIG. 1) for switching on and off the precharge/equalize circuit. The precharge/equalize circuit illustrated in FIG. 1 is also known in prior art and is, for instance, described in the above-mentioned section of the book by Itoh.

A plurality of memory cells are connected to each of the bit lines 6 and 7. The memory cell including a memory capacitor 21 is adapted to be connected with the bit line 6, for instance, via the source-drain path of an access transistor 22 including an NMOS-FET and adapted to be triggered via the word line 23. Equally, the memory cells including the memory capacitors 23, 24, and 25 are adapted to be connected via corresponding access transistors 26, 27 or 28, respectively, and word lines 29, 30 and 31 with the corresponding bit lines.

Figure 2:
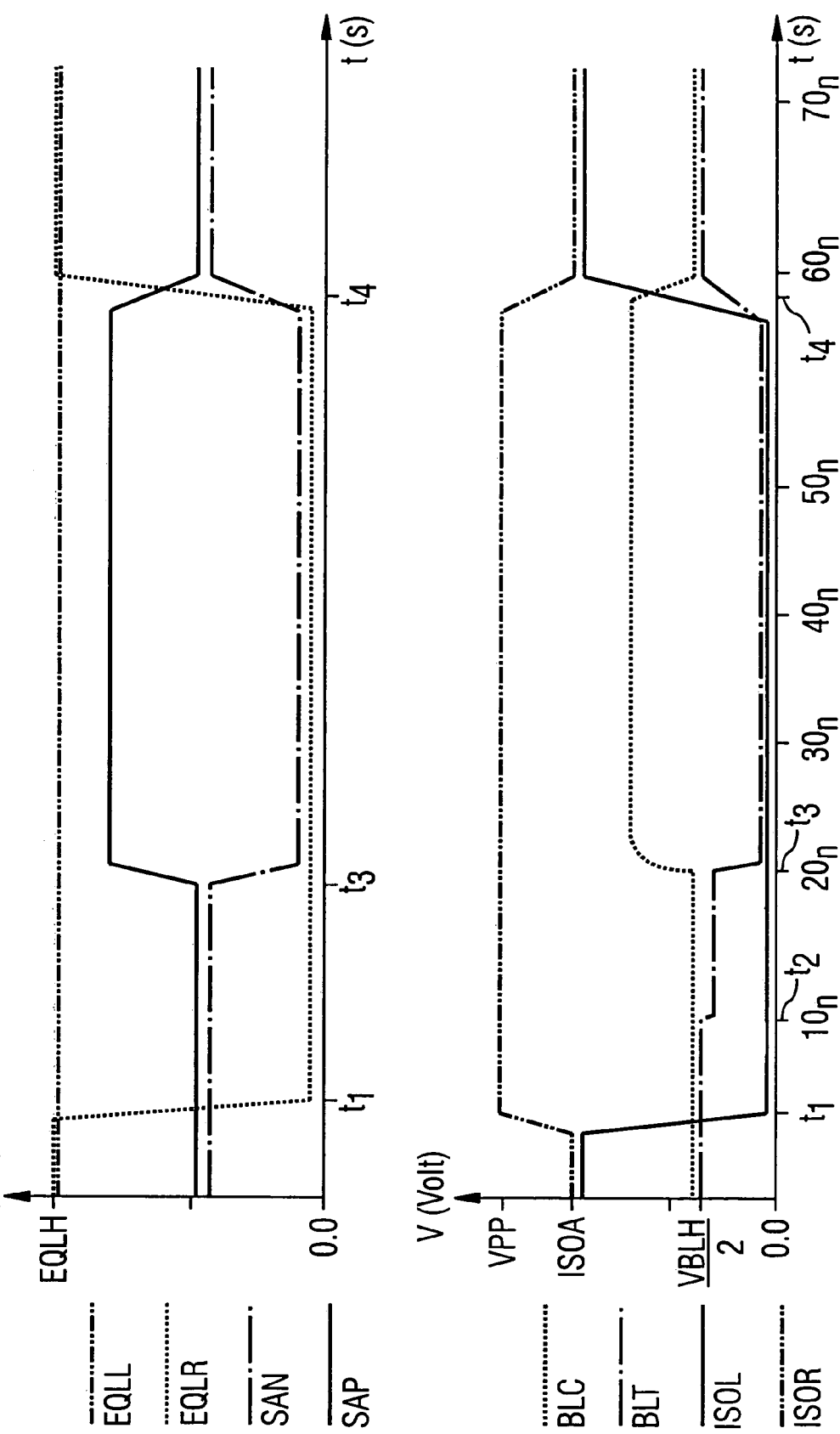
FIG. 2 shows a signal diagram of various signals that are relevant during the reading out of a memory cell of the DRAM illustrated in FIG. 1.

FIG. 2 illustrates the signal courses of signals occurring in the circuit of FIG. 1 during a reading cycle. It is assumed that the content of the memory cells positioned at the right side of the read amplifier 1 is to be read out. A reading process is reported to the DRAM by an appropriate read instruction. Appropriate line decoders activate, for instance, the word line 31 and the bit line 6 to read out the data value stored in the memory cell 24 that is positioned at the point of intersection of the word line 31 and the bit line 6.

Prior to the beginning of the reading process, i.e. prior to the time t1 illustrated in FIG. 2, the NMOS-FETs 15, 16, 17 and 18, 19, 20 of the two precharge/equalize circuits 32 or 14, respectively, are connected through. The control voltages EQLL and EQLR which are applied by a control circuit for switching on and off the precharge/equalize circuit (not illustrated in FIG. 1) are identical and are referred to as EQLH. By means of the precharge/equalize circuits the corresponding sections of the bit line 6 and of the complementary bit line 7 are thus charged to the same voltage potentials which correspond to VBLH/2 in the instant case.

At the time t1, the process of precharging of the bit line sections positioned at the right of the read amplifier is interrupted by the precharge/equalize circuit 14 to prepare a reading out of the memory cells 24 and 25 positioned at the right of the read amplifier. The control circuit for switching on and off the precharge/equalize circuit now applies a control signal EQLR with a voltage of 0 volts to the gate terminals of the NMOS-FETs of the precharge/equalize circuit 14, so that they block, this preventing a further charging of the sections of the bit line 6 and the complementary bit line 7 connected with the source-drain paths of these NMOSFETs. The control circuit for switching on and off the precharge-/equalize circuit further applies an EQLL signal with a high level to the gate terminals of the NMOS-FETs of the left precharge/equalize circuit, so that the precharging process of the corresponding sections of the bit line and of the complementary bit line positioned at the left of the read amplifier in FIG. 1 continues.

At the time t1, the read amplifier 1 is also simultaneously decoupled from the circuit parts positioned at the left of the read amplifier in FIG. 1, so that it may "concentrate" on the reading out of the right memory cells. The isolation circuit 8 positioned at the left of the read amplifier is responsible for decoupling. Prior to decoupling, a uniform "bias voltage" is available at the gate terminals of the isolation transistors 10, 11, 12, and 13 of the two isolation circuits 8 and 9, which is referred to as ISOA in FIG. 2 and which corresponds to the voltage VINT generated internally on the DRAM chip. When ISOA is applied, the read amplifier is coupled both to the circuit elements positioned at the left and to the circuit elements positioned at the right thereof. At the time t1, the control voltage ISOL of the NMOS-FETs 10 and 11 of the left isolation circuit 8 is now reduced to 0 volts, this causing them to be blocked and the read amplifier to be decoupled from the left side. At the same time, improved coupling of the right side of the read amplifier is effected by the control voltage ISOR of the NMOS-FETs 12 and 13 of the right isolation circuit 9 being raised to a voltage VPP that lies above VINT.

At the time t2 marked on the time axis in FIG. 2, the word line 31 activates the access transistor 28 which then connects through, so that the voltage available at the memory capacitor 24 of a memory cell modifies the potential BLT of the bit line 6, which is illustrated in FIG. 2 between the times t2 and t3 by the slight decreasing of the voltage BLT vis-à-vis the voltage BLC at the opposite section of the complementary bit line.

This slight voltage difference between the voltages BLT and BLC is now amplified by the read amplifier 1 at time t3 by the activating voltages SAN and SAP being applied to the read amplifier.

The data value read out from the memory cell 24 is now available at the read amplifier 1 with a sufficiently amplified voltage level, so that it may be tapped via transistors (not illustrated in FIG. 1) and be transferred to the data output of the DRAM.

At the end of the reading cycle the word line 31 is run down, so that the memory cell 24 obtains the reamplified data value. At the time t4 in FIG. 2, ISOL and ISOR are then also run back to the initial value ISOA=VINT, so that the read amplifier is again coupled with the two circuits sides thereof. At the same time, the supply voltages SAN and SAP of the read amplifier 1 are brought back to their precharge positions (=VBLH/2). Finally, the control voltage for switching on and off the precharge/equalize circuits again triggers the NMOS-transistors 18, 19 and 20 of the right precharge/equalize circuit 14 with EQLR=EQLH, so that the sections of the bit line and of the complementary bit line positioned at the right of the read amplifier 1 are again precharged to the common bias voltage VBLH/2.

In the case of DRAM circuits that were conceived prior to the present invention, it was sufficient to select the voltages EQLH and ISOA such that they corresponded to the supply voltage VINT generated internally on the DRAM chip. In accordance with the invention, the supply voltage of the DRAM chip and thus also VINT is to be reduced for the purpose of reducing the power consumption of the DRAM chip, this effecting that the selection EQLH=ISOA=VINT is no longer possible since the precharge time for precharging the bit line would become too long during normal memory access and would violate component specifications which provide, for instance, a duration of only 10 ns to 20 ns between two memory accesses. With reduced operating voltages of the DRAM chip it is thus necessary to provide a voltage increasing device positioned on the chip, e.g. a charge pump circuit, which may be connected with VINT, for generating the EQLH voltage required for precharging the bit line sections during normal memory access.

When the voltage EQLH that is increased vis-à-vis the reduced voltage VINT is used for every memory access, a large additional power consumption of the DRAM chip results due to the high capacitance of the EQL line (in a read amplifier strip there are up to 8 k read amplifiers!) as compared to a DRAM chip that can do without increased EQLH voltage, so that the original purpose of the reduction of the power consumption by reducing the supply voltage of the DRAM chip is partially counteracted. This additional power consumption is especially annoying during the so-called self-refresh mode of the DRAM. In the self-refresh mode, the contents of the memory cells are refreshed periodically. The period typically lies in the range of 7.9 microseconds from one word line to the next one, so that all the word lines have been activated once after, for instance, 64 ms. The self-refresh process takes place by periodically activating all word lines, amplifying the charge information contained in the activated memory cells by the read amplifiers, and re-writing the amplified information in the memory cells. The self-refresh mode is employed whenever the DRAMS are not required actively in the system which they belong to and merely are to maintain the information stored. One example of such a self-refresh mode are e.g. PDAs (PDS=Personal Digital Assistant), mobile phones, or other mobile devices such as laptops in standby operation. Since such devices are, as a rule, battery-operated, the increased power consumption is especially undesired here since a battery lifetime as long as possible is one of the most important objects when conceiving these devices.

In one embodiment of the invention, a quick precharging of the bit lines is necessary only during the normal memory cell access mode of the DRAM, but not during the memory cell self-refresh mode of the DRAM that takes place periodically at relatively large time intervals.

Therefore, in accordance with the invention the control circuit for switching on and off the precharge/equalize circuit is designed such that it applies a control signal with a first voltage level to the precharge/equalize circuit for switching on the precharge/equalize circuit and for precharging the bit lines in normal memory cell self-refresh mode, and applies a control signal with a second voltage level to the precharge/equalize circuit for switching on the precharge/equalize circuit and for precharging the bit lines in normal memory cell access mode, said second voltage level differing from the first voltage level and being selected such that the period between the output of the control signal and the finishing of the precharging of the bit lines is larger in the memory cell self-refresh mode than in the normal memory cell access mode.

In accordance with a preferred embodiment, the first voltage level is lower than the second voltage level and preferably corresponds to the voltage VINT internally generated on the DRAM chip, which is used prior to the reading out of memory cells also for triggering the isolation circuits 8 and 9. The second voltage level corresponds to a voltage EQLH that is preferably derived from the internal voltage VINT via a pump circuit or some other voltage increasing circuit and is increased vis-à-vis VINT.

This reduces the time of increased power consumption to the memory accesses in the normal memory cell access mode of the DRAM. During the memory cell self-refresh mode there results a reduced power consumption, which is important especially for battery-operated devices where a high proportion of power consumption results from the standby operation that is predominant in time vis-à-vis the active operation (e.g. mobile phones which are operated only temporarily for the purpose of storing new data).

The most various realizations are conceivable for the control circuit for switching on and off or triggering, respectively, the precharge/equalizing circuits of the DRAM in accordance with the invention, which are capable of applying the lower control voltage VINT to the gate terminals of the transistors of the precharge/equalize circuits of the DRAM in the memory cell self-refresh mode during the charging of the bit lines, and of applying the increased control voltage EQLH to the gate terminals of the transistors of the precharge/equalize circuit in the normal memory cell access mode during the charging of the bit lines.

The control circuit for triggering the precharge/equalize circuits preferably receives a signal from the remaining control circuits of the DRAM chip, the signal indicating whether or not the DRAM is being in a memory cell self-refresh mode.

Figure 3A:
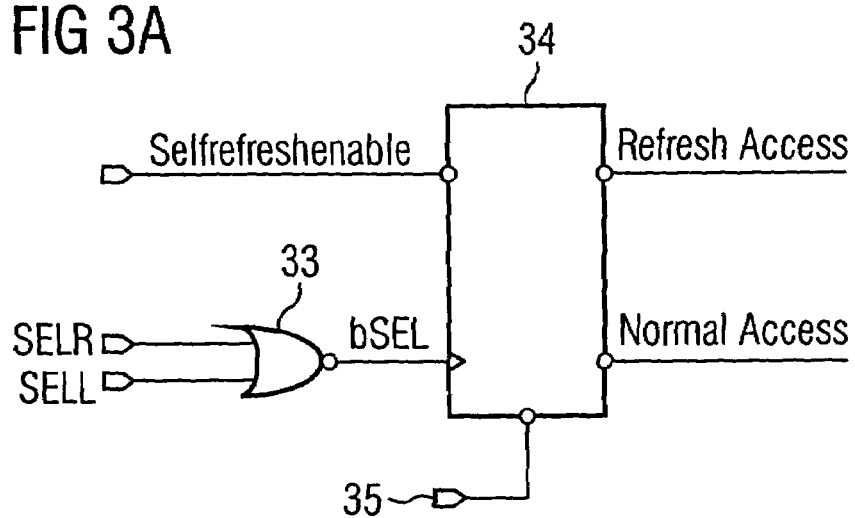
FIG. 3 shows components of a control circuit for triggering the precharge/equalize circuits of a DRAM used with an embodiment of the invention.

In FIGS. 3a, b, and c, three cooperating circuit elements are illustrated which are adapted to contribute, in accordance with an embodiment of the invention, to realize a control circuit for switching on and off the precharge/equalize circuit.

Figure 3B:
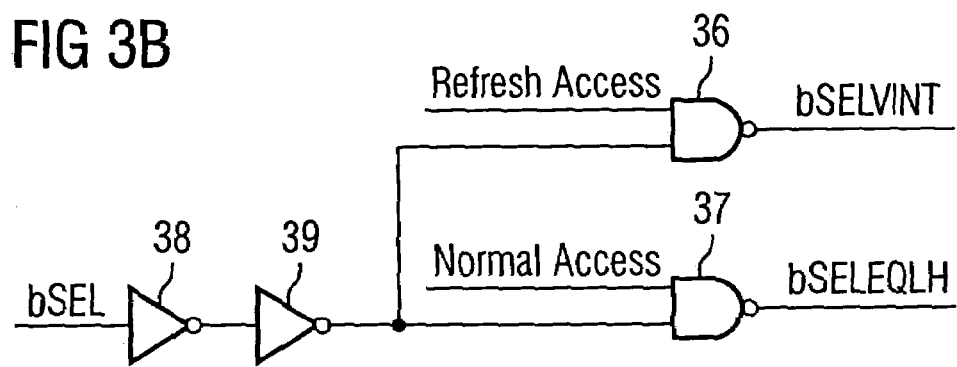
Figure 3C:
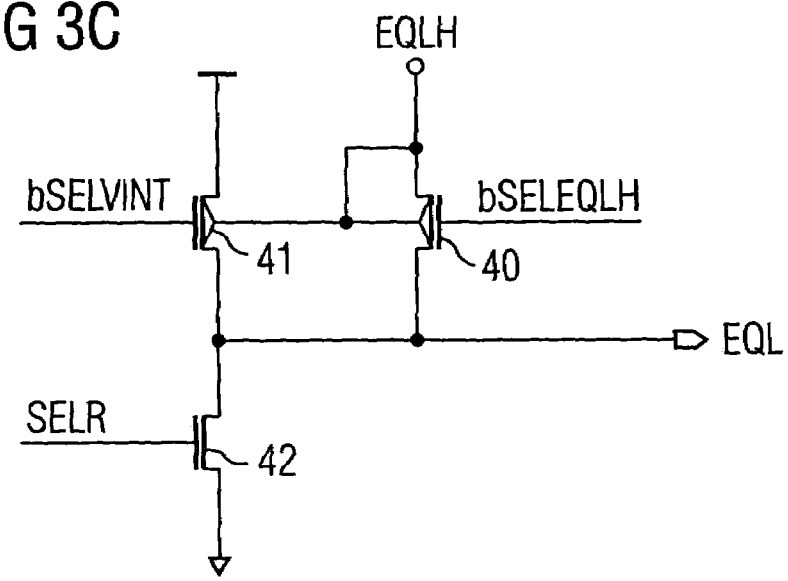
Figure 4:
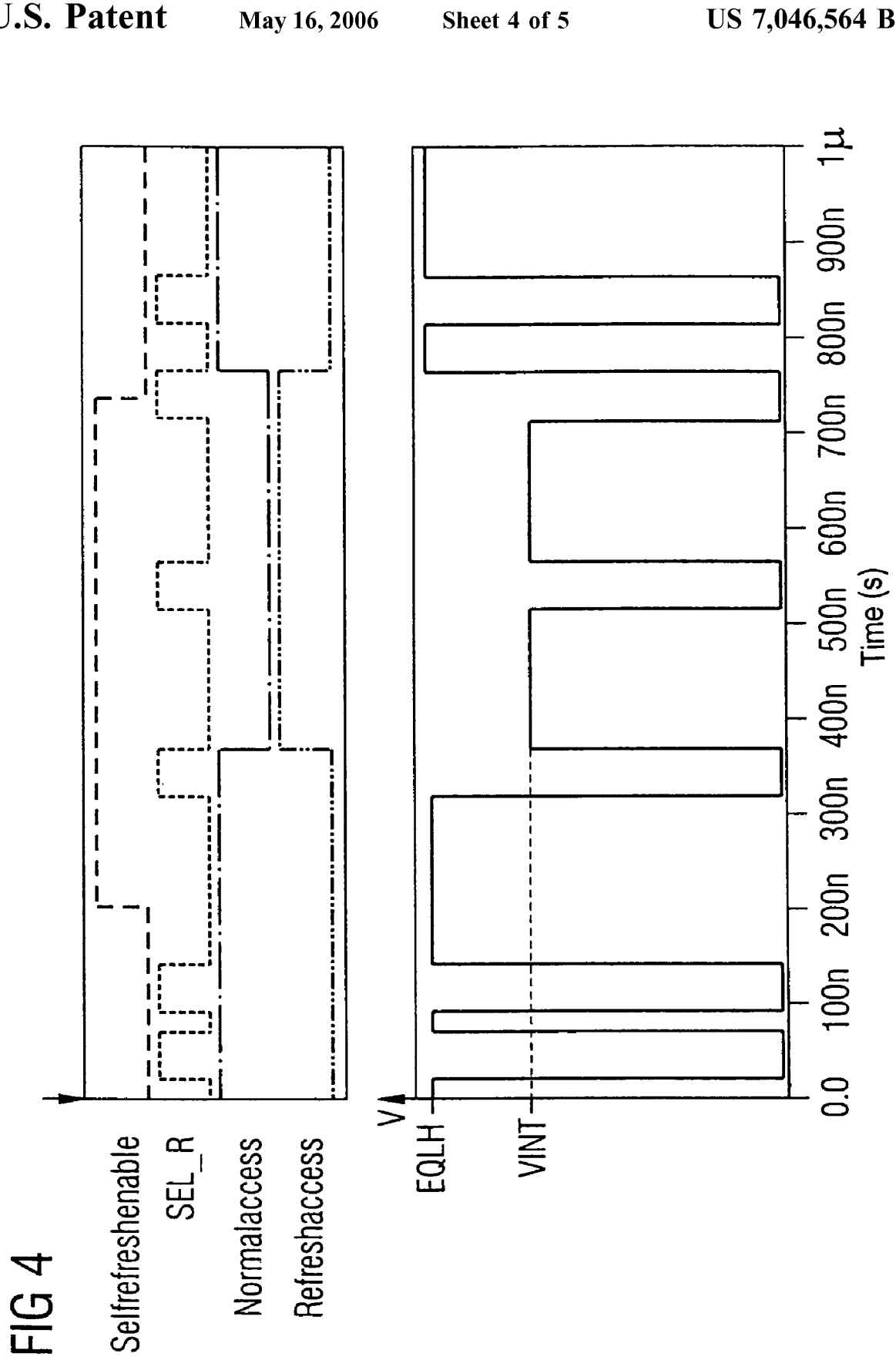
FIG. 4 a signal diagram with various signals that occur with the control circuit illustrated in FIG. 3.

The signal courses resulting with the circuit elements illustrated in FIG. 3 are illustrated in FIG. 4.

FIG. 3 illustrates a NOR gate 33, the inputs of which are connected with the signals SELR and SELL. The signal SELR assumes an h-level when the read amplifier is addressed and the bit line section positioned at the right of the read amplifier in FIG. 1 is to be read out. When SELR assumes an h-level, EQLR drops to zero volts. The signal SELL assumes an h-level when the read amplifier is addressed and the bit line section positioned at the left of the read amplifier in FIG. 1 is to be read out. When SELL assumes an h-level, EQLL drops to zero volts.

The output of the NOR gate 33 is connected with the clock edge-controlled input of a latch memory 34 (flip-flop). The latch memory 34 moreover comprises a reset input 35 and an input for a signal "Selfrefreshenable" which represents the information of whether or not the DRAM chip is in the memory cell self-refresh mode. When the DRAM is in the memory cell self-refresh mode, then Selfrefreshenable=1, i.e. assumes an h-level; when the DRAM is not in the memory cell self-refresh mode, then Selfrefreshenable=0 and consequently assumes an l-level.

At the end of a memory access, i.e. at the falling edge of the signal SELR (or SELL, respectively), the information of whether the DRAM device is in the memory cell self-refresh mode is read into the latch memory 34. The latch memory outputs at its output the complementary signals "RefreshAccess" und "NormalAccess". The course of these signals is illustrated in FIG. 4 as a function of the signals "Selfrefreshenable" and SELR.

It is important to evaluate the self-refresh mode information (Selfrefresh signal) at the moment of entering the precharging mode since the self-refresh accesses in the DRAM device take place asynchronously to the external clock of the DRAM. The user can thus program the end of the self-refresh mode during an ongoing self-refresh access. For this last self-refresh access, a normal cell field access can thus be performed relatively quickly, for which the bit lines quickly have to be precharged correctly.

In accordance with the further circuit component illustrated in FIG. 3b, the signals "RefreshAccess" and "NormalAccess" output by the latch memory 34 each are applied to the input of a NAND gate 36 or 37, respectively. The NAND gates 36 and 37 receive at their inputs the output signal bSEL that is output by the output of the NOR gate 33, which has been guided via two inverters 38 and 39 before. The signals bSELVINT or bSELEQLH, respectively, output by the NAND gates 36 and 37 are then used in accordance with FIG. 3c as control signals of two PMOS-FETs 40 and 41.

The circuit illustrated in FIG. 3c, which is positioned at the output of the control circuit for switching on and off the precharge/equalize circuits, comprises a first PMOS-FET 41, the source-drain path of which is connected between a supply voltage and the source-drain path of an NMOS-FET 42, the gate terminal of which is controlled by the signal SELR. The output signal EQL that is used for triggering the NMOS-FETs of the precharge/equalize circuit is tapped between the connection points of the source-drain paths of the two transistors 41 and 42. The source-drain path of a second PMOS-FET 40 is connected between the pumped voltage EQLH and the output of the control voltage at which the voltage EQL occurs (=EQLR or EQLL). The gate terminal of the second PMOS-FET 40 is controlled by the signal bSELEQLH derived from the output of the NAND gate 37.

As can be recognized in FIG. 4, as a function of the information latched in the latch memory 34, EQL is now raised in the precharging state to EQLH (in the normal memory cell access mode) or merely to VINT (in the memory cell self-refresh mode).

The logic NOR connection of SELL and SELR is necessary for the following reasons. After a lengthy time in the self-refresh mode, all EQL lines are at voltage VINT in the precharging state. Since, at the end of a self-refresh mode, not all EQL lines can simply be charged to the higher voltage EQLH, since this would again increase power consumption, they remain at VINT. After an access e.g. to the section of the pair of bit lines positioned at the right of the read amplifier, precharging of the bit line is, however, to be effected both via the right and the left EQL pairs. To this end, it is necessary to newly latch the new self-refresh information both for the right and for the left EQL pair.

FIG. 5 shows a section from the layout for the chip region of a DRAM. It can be recognized that the read amplifier strips that comprise the read amplifier circuits are positioned between the cell fields that comprise the memory cells. An efficient layout implementation of the further circuit members according to the invention can be obtained when as many circuit members as possible are removed from the area-critical regions of the chip layout. In accordance with the draft illustrated in FIG. 5, the latch memories 34 and the driver circuits for generating the VINT voltage are positioned above the cell field and externally of the read amplifier strip. This is possible since the driving of the EQL voltages to VINT is not time-critical because the self-refresh mode runs with a relatively long period of several microseconds. A long running time of the signals on the EQL line can therefore be tolerated. In FIG. 5, the left EQL line and the right EQL line, respectively, are designated with EQL_L and EQL_R. The drivers for driving the EQL line to the pumped voltage EQLH or for driving to mass (EQLH/mass driver), respectively, are, however, distributed over the read amplifier strip. This enables quick EQL driving to mass and EQLH, which is required for normal memory access.

The semiconductor memory according to the invention may, in accordance with another embodiment, also operate with a voltage (VDD) generated externally of the semiconductor memory chip for triggering the precharge/equalize circuit in the memory cell self-refresh mode, and with a voltage (VDD+DELTAV) generated from the external voltage by a voltage increasing device during the normal memory cell access mode.

LIST OF REFERENCE SIGNS 1 read amplifier
2 first NMOS-FET of the read amplifier
3 second NMOS-FET of the read amplifier
4 first PMOS-FET of the read amplifier
5 second PMOS-FET of the read amplifier
6 bit line
7 complementary bit line
8 first isolation circuit
9 second isolation circuit
10 first NMOS-FET of the first isolation circuit
11 second NMOS-FET of the first isolation circuit
12 first NMOS-FET of the second isolation circuit
13 second NMOS-FET of the second isolation circuit
14 second precharge/equalize circuit
15 first NMOS-FET of the first precharge/equalize circuit
16 second NMOS-FET of the first precharge/equalize circuit
17 third NMOS-FET of the first precharge/equalize circuit
18 first NMOS-FET of the second precharge/equalize circuit
19 second NMOS-FET of the second precharge/equalize circuit
20 third NMOS-FET of the second precharge/equalize circuit
21 memory capacitor of a memory cell
22 access transistor for a memory cell
23 memory capacitor of a memory cell
24 memory capacitor of a memory cell
25 memory capacitor of a memory cell
26 access transistor for a memory cell
27 access transistor for a memory cell
28 access transistor for a memory cell
29 word line
30 word line
31 word line
32 first precharge/equalize circuit
33 NOR gate
34 latch memory (flip-flop)
35 refresh input of the latch memory
36 first NAND gate
37 second NAND gate
38 first inverter
39 second inverter
40 PMOS-FET
41 PMOS-FET
42 NMOS-FET
BLC voltage at the complementary bit line
BLT bit line voltage
bSEL output signal of the first NAND gate
bSELEQLH output signal of the first NAND gate
bSELVINT output signal of the second NAND gate
EQL output signal of the control voltage for sitching on and off the precharge/equalize circuit
EQL_L left EQL line
EQL_R right EQL line
EQLH maximum value of the control voltage of the precharge/equalize circuit
EQLL control voltage of the left precharge/equalize circuit
EQLR control voltage of the right precharge/equalize circuit
ISOA maximum value of the control voltage of the isolation circuit
ISOL control voltage of the left isolation circuit
ISOR control voltage of the right isolation circuit
RefreshAccess, NormalAccess output signals of the latch memory
SAN first activating voltage of the read amplifier
SAP second activating voltage of the read amplifier
Selfrefreshenable signal supplying the information of whether the DRAM is in the memory cell self-refresh mode
SELL signal indicating that a bit line positioned at the left of the read amplifier is to be read out
SELR signal indicating that a bit line positioned at the right of the read amplifier is to be read out
VBLH/2 bias voltage applied to the bit lines

What is claimed is:

1. A semiconductor memory with a memory subunit, comprising:
a memory cell in which a data value is stored and adapted to be connected with a bit line to which a complementary bit line is assigned;
a precharge/equalize circuit assigned to the memory cell, the precharge/equalize circuit serving to charge, prior to reading out of the memory cell, the bit line and the complementary bit line in a region of the memory cell to a same voltage level, and being switched off during the reading out of the memory cell;
a control circuit connected with the precharge/equalize circuit for switching on and off the precharge/equalize circuit, wherein
the control circuit for switching on and off the precharge/equalize circuit is designed such that it outputs a control signal with a first maximum voltage level to a control gate of the precharge/equalize circuit for switching on the precharge-/equalize circuit and for precharging the bit lines in a memory cell self-refresh mode, and outputs a control signal with a second maximum voltage level to the control gate of the precharge/equalize circuit for switching on the precharge/equalize circuit and for precharging the bit lines in a normal memory cell access mode, the second maximum voltage level differing from the first maximum voltage level and being selected such that a period of time between a start of the output of the respective control signal and completion of the precharging of the bit lines in the memory cell self-refresh mode is larger than in the normal memory cell access mode.

2. The semiconductor memory according to claim 1, wherein the first voltage level is lower than the second voltage level.

3. The semiconductor memory according to claim 2, wherein the first voltage level corresponds to a voltage generated internally on a chip of the semiconductor memory, and the second voltage level is derived from the voltage generated internally on the chip of the semiconductor memory by making use of a voltage increasing device.

4. The semiconductor memory according to claim 2, wherein the first voltage level corresponds to a voltage generated externally of a chip of the semiconductor memory, and the second voltage level is derived from the voltage generated externally of the chip of the semiconductor memory by making use of a voltage increasing device.

5. The semiconductor memory according to claim 1, further comprising a plurality of subunits positioned along the bit lines.

6. The semiconductor memory according to claim 5, further comprising a plurality of read amplifier circuits to each of which two memory subunits positioned at a left and at a right of the read amplifier circuit along the bit lines are assigned, with which the read amplifier circuit can be connected via the bit lines.

7. The semiconductor memory according to claim 6, wherein
the read amplifier circuits are adapted to be connected with the memory subunit positioned at the left thereof via a first isolation circuit and with the memory subunit positioned at the right thereof via a second isolation circuit, and
the isolation circuits se the read amplifier either for amplifying the signal generated in the memory subunit positioned at the left thereof and derived from a memory cell, or for amplifying the signal generated in the memory subunit positioned at the right thereof and derived from a memory cell.

8. The semiconductor memory according to claim 7, wherein each isolation circuit includes two MOS-FETs, wherein by a first of the two MOS-FETs the connection between the read amplifier and the memory subunit formed by the bit line can be interrupted, and by a second of the two MOS-FETs the connection between the read amplifier and the memory subunit formed by the complementary bit line can be interrupted.

9. The semiconductor memory according to claim 8, wherein the voltage used for triggering the MOS-FETs of the isolation circuits corresponds, prior to selection of one of the two memory subunits positioned at the left and at the right of the read amplifier, to the voltage generated internally on the chip.

10. The semiconductor memory according to claim 9, wherein the voltage used for triggering the MOS-FETs of an isolation circuit that is connected with a memory cell to be read out at the moment is raised, prior to the reading out of the memory cell, above the voltage generated on the chip, wherein the voltage used for triggering the MOS-FETs of another isolation circuit connected with the read amplifier is simultaneously decreased to mass potential.

11. The semiconductor memory according to claim 1, wherein the precharge/equalize circuit comprises two MOS-FETs, source-drain paths of which form a series connection that is connected between the two bit lines, wherein a connection point of the two source-drain paths is connected with a voltage that corresponds to half of a bit line voltage in an h-state, and wherein the precharge-/equalize circuit comprises a further MOS-FET, the source-drain path of which is connected between the two bit lines, wherein gate terminals of three MOS-FETs are connected with one another and with an output of the control circuit for switching on and off the precharge/equalize circuit.

12. The semiconductor memory according to claim 6, wherein each read amplifier circuit comprises a flip-flop.

13. The semiconductor memory according to claim 1, wherein each memory cell includes a capacitor that is adapted to be connected with one of the bit lines via a MOS-FET triggered by a word line.

14. The semiconductor memory according to claim 1, wherein the control circuit for switching on and off the precharge/equalize circuit comprises a flip-flop and a plurality of logic gates.

15. The semiconductor memory according to claim 14, wherein the logic gates comprise a NOR gate and two NAND gates.

16. The semiconductor memory according to claim 1, wherein the control circuit for switching on and off the precharge/equalize circuit receives a chip-internal signal whose state represents information of whether the semiconductor memory is in a memory cell self-refresh mode.

17. The semiconductor memory according to claim 6, wherein the memory subunits are arranged in a layout of a chip of the semiconductor memory in two-dimensional cell fields, wherein a strip in which the read amplifier circuits are arranged is positioned along one side of a cell field.

18. The semiconductor memory according to claim 17, wherein the read amplifier circuit strip also incorporates a line via which the signals for the parallel switching on and off of the precharge/equalize circuits of a plurality of memory subunits that are positioned in the cell field can be guided.

19. The semiconductor memory according to claim 18, wherein driver circuits for generating the first voltage level are locally centered in an edge region of the cell field outside the read amplifier strip, and wherein driver circuits for generating the second voltage level and the mass level are distributed along one side of the cell field in the read amplifier strip at predetermined mutual distances.

20. The semiconductor memory according to claim 12, wherein the flip-flops of the control unit for switching on and off the precharge/equalize circuits are positioned in an edge region.

21. The semiconductor memory according to claim 1, wherein the semiconductor memory is a DRAM.

22. A battery-operated device, comprising:
a semiconductor memory having a memory subunit, comprising:
a memory cell in which a data value is stored and adapted to be connected with a bit line to which a complementary bit line is assigned;
a precharge/equalize circuit assigned to the memory cell, the precharge/equalize circuit serving to charge, prior to reading out of the memory cell, the bit line and the complementary bit line in a region of the memory cell to a same voltage level, and being switched off during the reading out of the memory cell;

a control circuit connected with the precharge/equalize circuit for switching on and off the precharge/equalize circuit, wherein the control circuit for switching on and off the precharge/equalize circuit is designed such that it outputs a control signal with a first maximum voltage level to a control gate of the precharge/equalize circuit for switching on the precharge-/equalize circuit and for precharging the bit lines in a memory cell self-refresh mode, and outputs a control signal with a second maximum voltage level to the control gate of the precharge/equalize circuit for switching on the precharge/equalize circuit and for precharging the bit lines in a normal memory cell access mode, the second maximum voltage level differing from the first maximum voltage level and being selected such that a period of time between a start of the output of the respective control signal and completion of the precharging of the bit lines in the memory cell self-refresh mode is larger than in the normal memory cell access mode.

23. The semiconductor memory according to claim 19, wherein the flip-flops of the control unit for switching on and off the precharge/equalize circuits are positioned in an edge region.

* * * * *